United States Patent [19]

Cosenza

[11] Patent Number: 5,090,840
[45] Date of Patent: Feb. 25, 1992

[54] PRINTED CIRCUIT BOARD MOUNTING APPARATUS

[75] Inventor: Frank J. Cosenza, Santa Barbara, Calif.

[73] Assignee: VSI Corporation, Chantilly, Va.

[21] Appl. No.: 594,756

[22] Filed: Oct. 9, 1990

[51] Int. Cl.$^5$ ................................................ B25G 3/00
[52] U.S. Cl. ................................. 403/409.1; 403/374; 361/388
[58] Field of Search ............ 403/409.1, 374, 24; 361/388; 439/59

[56] References Cited

U.S. PATENT DOCUMENTS

| | | | |
|---|---|---|---|
| 4,354,770 | 10/1982 | Block | 403/409.1 |
| 4,775,260 | 10/1988 | Keemer | 403/409.1 |
| 4,823,951 | 4/1989 | Colomina | 439/59 X |
| 5,036,428 | 7/1991 | Brownhill | 361/388 X |

Primary Examiner—Andrew V. Kundrat
Attorney, Agent, or Firm—Irving Keschner

[57] ABSTRACT

A locking wedge apparatus for fastening a printed circuit board within an elongated slot in a rack. The apparatus comprises a first member having an elongated, flexible portion terminating in first and second apertured end portions, the elongated and apertured end portions forming a rectangularly shaped channel. A rectangularly shaped member having a plurality of ramps formed along the edges of one surface is positioned in a U-shaped member having a plurality of ramps extending from the bottom wall thereof such that the ramps on each member are in engagement. The assembled U-shaped and rectangularly shaped members are positioned in the channel formed in the first member. A screw member extends lengthwise through said first apertured end portion, through a threaded aperture in said rectangularly shaped member and into said second apertured end portion. Rotating the screw in a forward direction causes the rectangularly shaped member to move along the ramp surfaces of the U-shaped member in a manner such that the elongated flexible portion of said first member is deflected transversely to lock the printed circuit board in place. The apparatus is designed such that a user can specify a desired side load and the corresponding U-shaped/rectangularly shaped combination selected such that the ramp angle therein provides the desired side load.

11 Claims, 4 Drawing Sheets

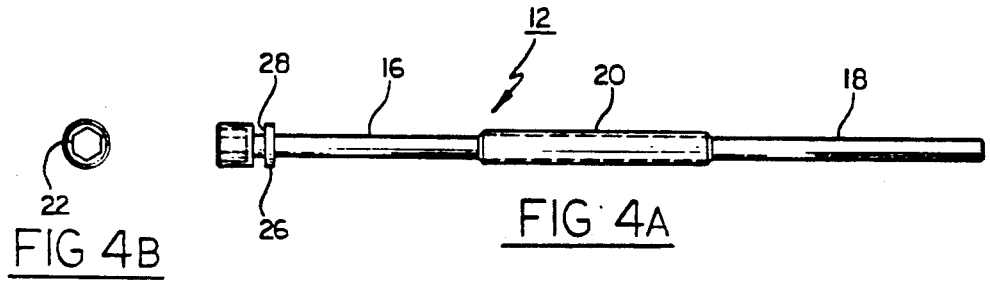
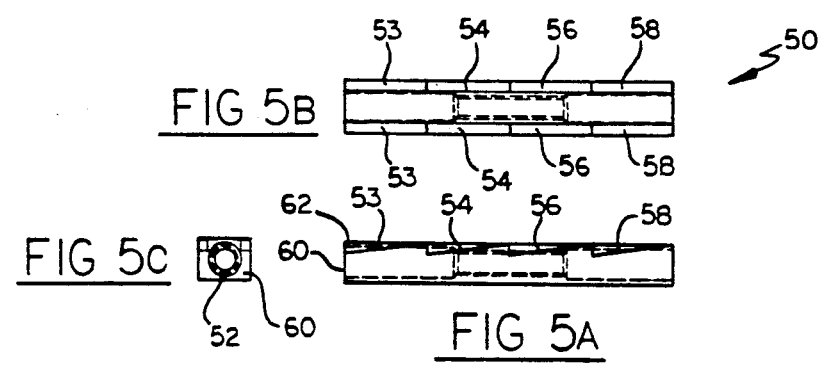
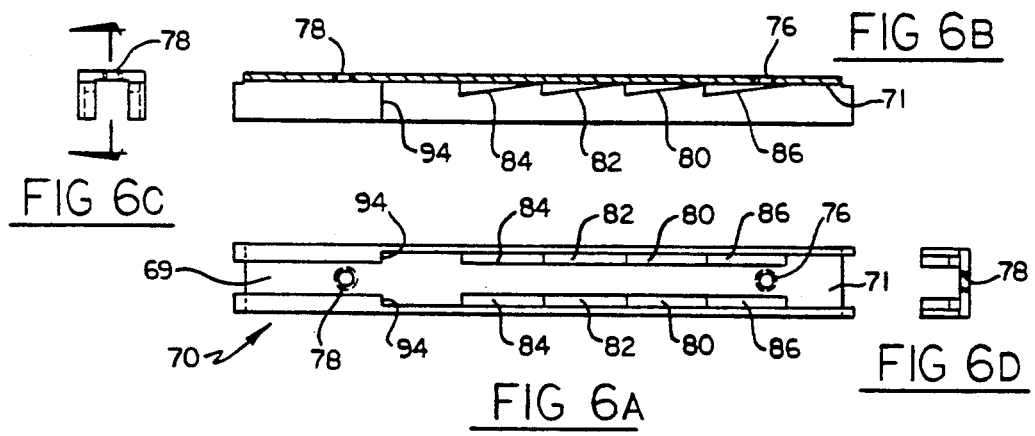
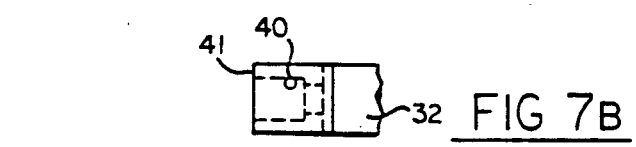
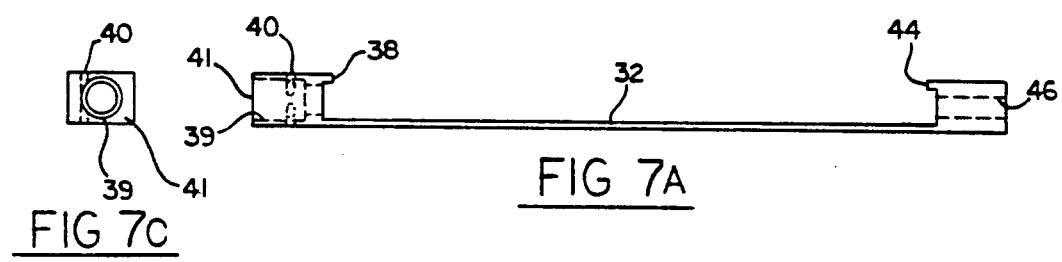

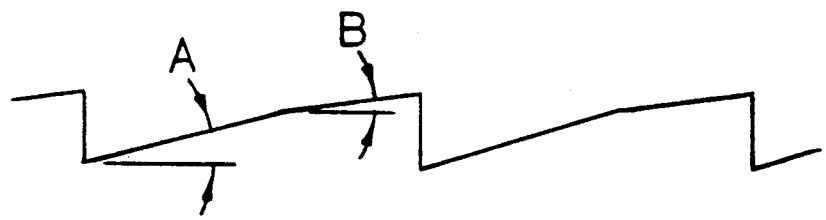
FIG 8
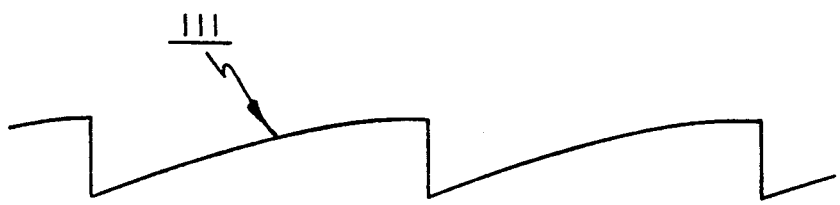
FIG 9
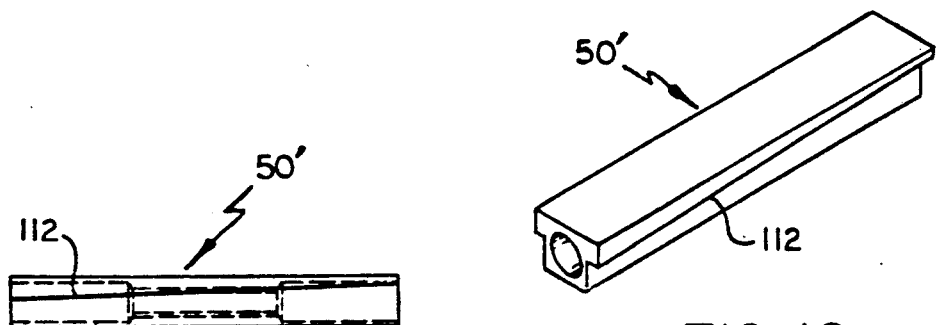
FIG 10A
FIG 10B

PRINTED CIRCUIT BOARD MOUNTING APPARATUS

BACKGROUND OF THE INVENTION

1. Field of the Invention

The present invention relates to apparatus for mounting and fastening printed circuit boards or cards within a rack or chassis, and, more particularly to an apparatus which includes an elongated flexible member that is deflected transversely to fasten the board in place.

2. Description of the Prior Art

Elongated wedge assemblies have been in use for fastening printed circuit (PC) boards within an elongated slot in a rack or chassis. One prior art device assembly includes a center wedge having sloped surfaces at its opposite ends and two end wedges having surfaces that abut against the center wedges' opposite ends. A screw extends lengthwise through the center wedge and connects together the two end wedges. Rotating the screw in one direction draws the two end wedges toward each other, causing them to deflect transversely on the sloped abutting surfaces. This increases the assembly's effective width and therefore fastens the PC board tightly within the slot. Subsequently rotating the screw in the opposite direction moves the two end wedges apart from each other to release the clamping force on the PC board.

Although the wedge assembly described above proved generally effective in locking the PC board in place, its use has not proven to be entirely satisfactory. For example, although applying the release torque (rotating screw in the opposite direction), the end wedges do not realign with the center wedge. This occurs because the screw thread is at one wedge end. Tightening compresses the wedges at an approximate 45° angle and forces them outward. The release torque only extends the threaded end wedge axially away from the center wedge. The wedges, although loosened to the extent that the PC board can be removed, do not realign themselves, making installation of the locking wedge assembly and PC board to the chassis track difficult.

The apparatus disclosed in U.S. Pat. No. 4,775,260 to Kecmer overcomes the disadvantages of the prior art elongated wedge assemblies by providing an apparatus which avoids the need for making torque measurements to insure proper installation and which also provides proper alignment of the apparatus' elements during installation. The apparatus includes a center wedge having sloped surfaces at its opposite ends and two end wedges having surfaces that abut against opposite ends of the center wedge, the center wedge being secured to the PC board. A screw extends lengthwise through a channel through the center wedge to connect together the two end wedges. When the screw is rotated in one direction, the two end wedges, together with the screw, are caused to move transversely relative to the center wedge, to increase the effective transverse width of the apparatus and thereby fasten the PC board in place. The screw is associated with clutch means for limiting the maximum forward torque that can be applied to the screw and thus the maximum transverse force the wedges can apply to the PC board. The clutch means disengages when more than a predetermined torque is applied.

Although the wedge assembly described in the aforementioned patent has proven generally effective in locking a PC board in place, there are limitations associated with its use. In particular, the end wedges utilize ramp angles of 45° to provide the wedging or deflecting action. It is well known that the side load force provided by the center wedge is determined by the angle of the sloped surfaces of the center wedge which abut against the sloped surfaces of the end wedges (the shallower the angle with the horizontal, the higher the side loads). Thus, in order to increase the side loads provided by the apparatus disclosed in the Kecmer patent, the angle of the sloped surface of the center wedge with respect to the horizontal would have to be decreased. In other words, the angle would have to be much shallower than the 45° angle shown in order to provide the necessary mechanical advantage. The problem is that the slope becomes so large that on shorter pieces a spacing problem would arise. In addition, making the screw smaller to reduce the size of the wedge apparatus would increase torquing problems. Thus, for small circuit boards and closer pitched spacing, it is difficult to modify the Kecmer apparatus. In the age of miniaturization where circuit boards and spacings are becoming smaller and thus smaller sized wedge assemblies having the capability of providing high side loads are required, this factor limits the utilization of the Kecmer apparatus. In essence, the apparatus shown in the Kecmer patent has a minimum size below which modification thereof would be ineffective. Even if the apparatus could be reduced in length to accommodate small size circuit boards and thus shallower spacing, the amount of side load available would be severely limited.

U.S. Pat. No. 4,823,951 to Colomins describes a locking wedge assembly similar to that shown in U.S. Pat. No. 4,775,260 and thus has similar disadvantages regarding size reduction and side load capability.

What is thus desired is to provide a simple and cost effective printed circuit board mounting apparatus which is of a smaller size than apparatus currently available and which, despite its smaller size, provides relatively high side loads.

SUMMARY OF THE PRESENT INVENTION

The present invention provides a printed circuit board mounting apparatus which is of a small size and which can be fabricated to provide a relatively high side load in a simple and cost-efficient manner.

The apparatus is utilized for fastening a printed circuit board within an elongated slot in a rack or chassis and comprises a first member having an elongated flexible portion terminating in first and second apertured end portions, the elongated and apertured end portions forming a rectangularly shaped channel. A rectangularly shaped member having a plurality of ramps formed along the edges of one surface is positioned in a U-shaped member having a plurality of ramps extending from the bottom wall thereof such that the ramps on each member are in engagement. The assembled U-shaped and rectangularly shaped members are positioned in the channel formed in the first member. A screw extends lengthwide through said first apertured end portion, through a threaded aperture in said rectangularly shaped member, and into said second apertured end portion. Rotating the screw in a forward direction causes the rectangularly shaped member to move along the ramp surfaces of the U-shaped member thereby causing the elongated flexible portion to deflect traversely to lock the printed circuit board in place. The apparatus is designed such that a user can specify a desired side load (relatively large side loads are available) and the corresponding U-shaped/rectangularly shaped combination selected such that their ramp angles provide the desired side load.

The apparatus of the present invention significantly improves over prior art circuit board mounting apparatus by providing a device which is smaller sized to accommodate the microminiaturization trend in the electronic industry, which provides higher side loads than are currently available both for normal and smaller sized mounting apparatus, which can be easily adapted to provide side loads to meet user requirements and wherein the operator can mechanically retract the elongated flexible portion for realignment. In particular, by simply modifying the ramp angle included in two of the components of the apparatus to correspond to the specified side load, the distributor (seller) of the apparatus has the capability of filling orders for a wide range of side loads.

The apparatus is relatively simple in construction (four components plus a locking pin) and thus is relatively inexpensive and reliable.

DESCRIPTION OF THE DRAWING

For a better understanding of the invention as well as other objects and further features thereof, reference is made to the following description which is to be read in conjunction with the accompanying drawing wherein:

FIG. 2b is an end view of the apparatus shown in FIG. 2a;

FIG. 3b is an end view of the assembly shown in FIG. 3a;

FIG. 4a and 4b illustrate a first component of the apparatus of the present invention;

FIGS. 5a-5c show the elevation, plane and end views, respectively, of a second component of the apparatus of the present invention;

FIGS. 6a-6d show the elevation, plane and end views of a third component of the apparatus of the present invention;

FIG. 7a-7c show the elevation, plane and end views of a fourth component of the apparatus of the present invention;

FIG. 8 illustrates a ramp profile which could be utilized to increase side loads;

FIG. 9 illustrates another ramp profile which could be utilized to increase side loads; and FIG. 10a-10b illustrates an alternate embodiment of the present invention.

DESCRIPTION OF THE PRESENT INVENTION

Figure 1:
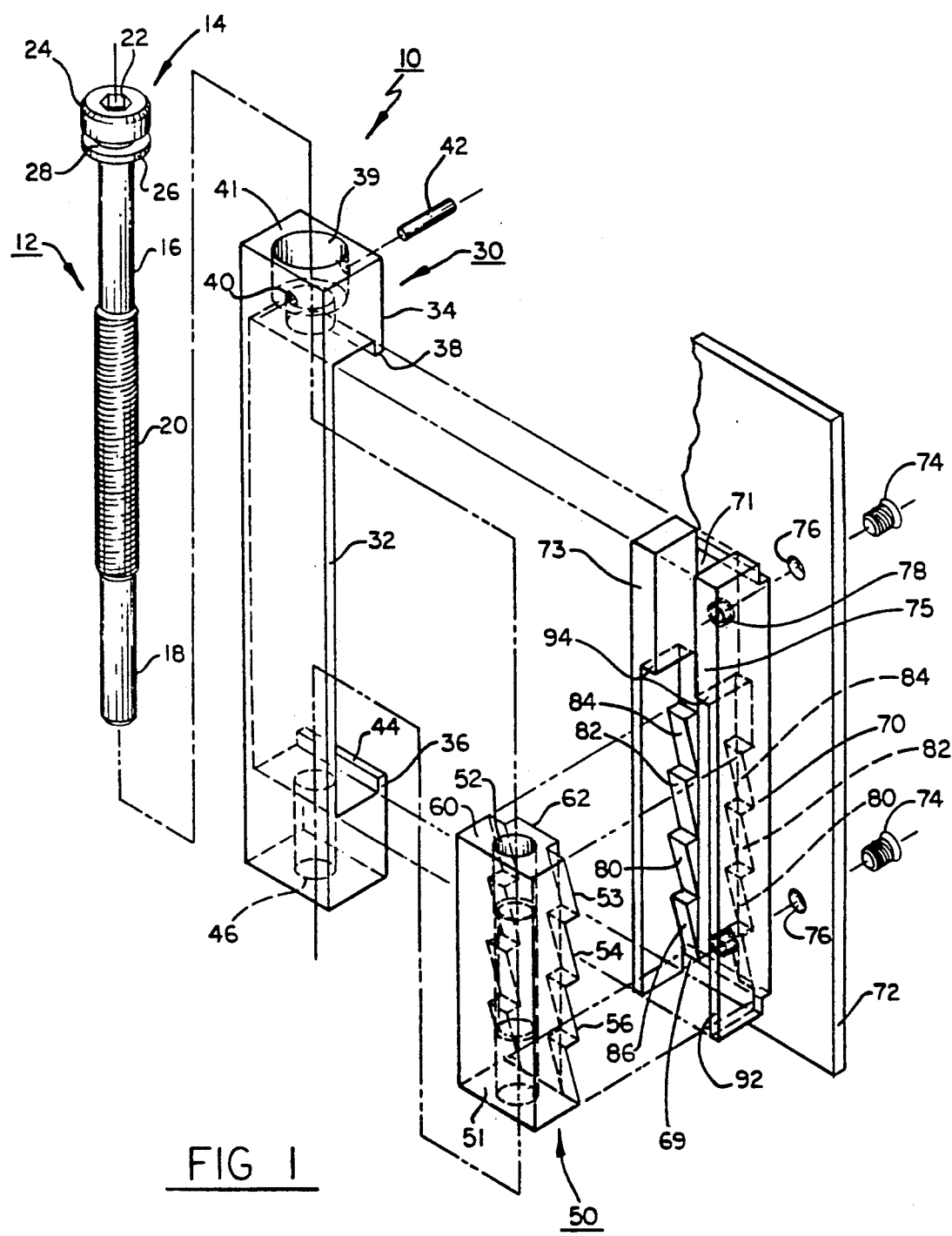
FIG. 1 is an exploded perspective view of the printed circuit board mounting apparatus of the present invention.

Referring now to FIG. 1, an exploded perspective view of the mounting apparatus 10 of the present invention is illustrated. Mounting apparatus 10 comprises an elongated screw 12 having head portion 14, shank portions 16 and 18 and threaded shank portion 20. Head portion 14 of screw 12 comprises a recess 22 to receive a hex key wrench, a first cylindrical portion 24 and a spaced disk-shaped portion 26, portion 24 being separated from portion 26 by a groove, or shelf, 28 as illustrated. Mounting apparatus 10 further comprises a C-shaped member 30 comprising a thin, elongated, deflectable portion 32 and terminating end portions 34 and 36. End portion 34 includes lip portion 38, a counterbore aperture 39 being formed therein and adapted to receive head portion 14 of screw 12. An aperture 40 is formed in end portion 34 as illustrated, a locking pin 42 being inserted therein after the screw 12 is inserted into aperture 39 in a manner to be described hereinafter. Terminating end portion 36 includes a lip portion 44 and an aperture 46 as illustrated. Member 30 is fabricated from a flexible metal material, preferably aluminum. Another component of mounting apparatus 10 is rectangularly shaped driving member 50 which has a threaded aperture 52 extending therethrough. A series of inclined surfaces, or ramps, 53, 54, 56 and 58 are formed along both edges of surface 62 of member 50, each series of ramps being separated by an elongated, rectangular section as shown. A driving member 70, shaped as a channel 69 having bottom wall 71 and vertical extending wall portions 73 and 75, is secured to the edge of a PC board 72 by screws or rivets 74 through aligned apertures 76 and 78 in PC board 72 and member 70, respectively. It should be noted that screws 74 are not necessary since the mounting apparatus can be wedged in place without being anchored to any part. A series of inclined surfaces, or ramps, 80, 82, 84, and 86 extend from bottom wall 71 adjacent vertical wall sections 73 and 75, as illustrated. The channel formed by the wall sections extends essentially along the entire length of member 70. The vertical terminating edge of surface 60 abuts against vertically extending wall portions 94 which function as stop or limiting members as will be described in more detail hereinafter. It should be noted that the ramps are integral with members 50 and 70, the members being formed out of a lightweight metal material, preferably aluminum.

Figure 2B:
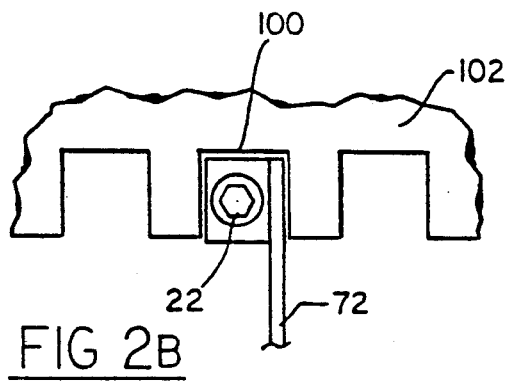
Figure 2A:
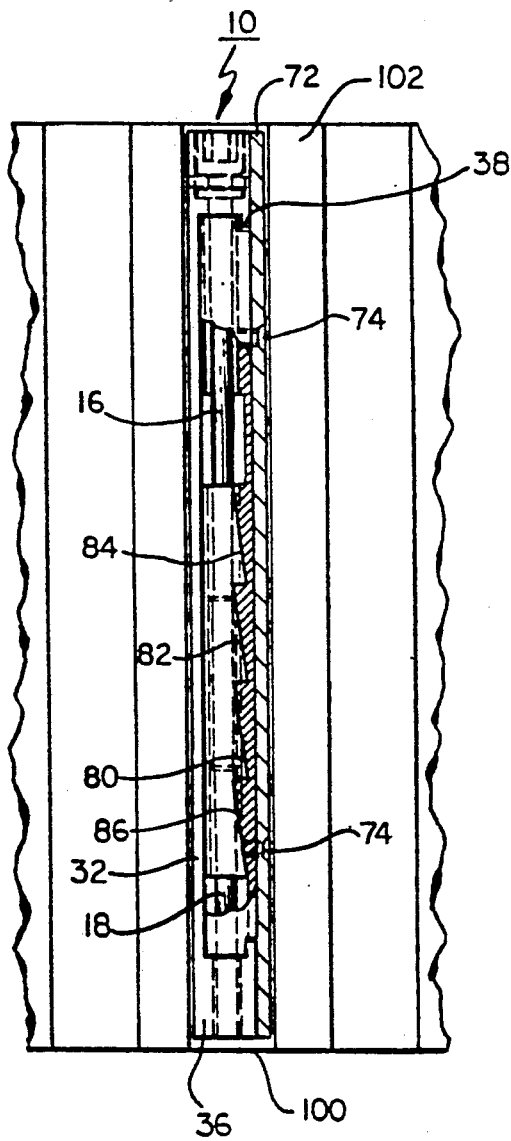
FIG. 2a is a plan view illustrating the apparatus of the present invention retaining a printed circuit board in a rack.

In the assembled position, member 50 is positioned within channel 69 of member 70 so that the surfaces 53, 54, 56 and 58 are positioned against surfaces 84, 82, 80 and 86, respectively, of member 70 as shown in FIG. 2a. In this position, the assembly comprising members 50 and 70 is then positioned in the channel formed in member 30 as illustrated. Screw 12 is then inserted through aperture 39 formed in end portion 34 of member 30, the screw being rotated such that threaded portion 20 thereof threadedly engages aperture 52 in member 50, the screw rotation continuing until the unthreaded shank portion 18 extends substantially through the aperture 46 in end portion 36. At this position, head 14 of screw 12 is positioned essentially coplanar with surface 41 of end portion 34. Locking pin 42 is then pressfit through aperture 40 in a manner such that it extends below the lower surface of cylindrical portion 24 in shelf 28. Locking pin 42 thus maintains screw 12 at the desired operating position and also prevents the screw from being removed from apparatus 10. As noted hereinabove, members 30, 50 and 70 are preferably, but not necessarily, made of aluminum (or an aluminum alloy). Screw 12 and locking pin 42 can be made of any suitable material such as stainless steel or alloy steel.

Figure 3B:
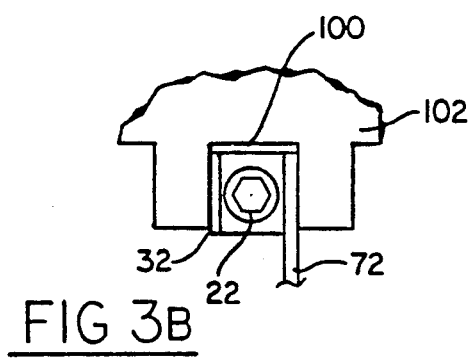
Figure 3A:
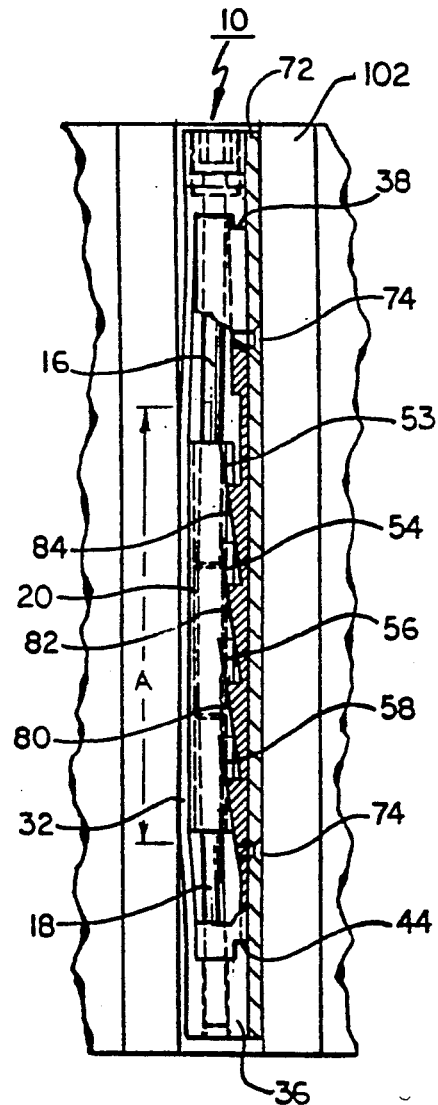
FIG. 3a is a view of the apparatus of FIG. 2a with the flexible member thereof deflected to secure a printed circuit board within the rack.

After mounting apparatus 10 has been assembled, it is secured to PC board 72, the PC board 72 being retained in elongated slot 100 formed in a chassis or a rack 102 (FIGS. 2 and 3). In the initial position (shown in FIG. 2a), the inclined surfaces, or ramps, of member 50 are arranged such that ramps 53, 54, 56 and 58 are with ramps 84, 82 80 and 86, respectively, on member 70.

In operation, a hex key wrench (not shown) engages the hex recess 22 of screw 12 and as the screw is rotated in a clockwise direction, member 50 is drawn in the longitudinal direction toward head portion 14. As it starts its movement, the angled surfaces of the ramps forces member 50 to move in the outward direction and to contact portion 32 of member 30. Due to the flexible nature of portion 32, the surface area indicated by A (FIG. 3a) of portion 32 contacted by surface 51 of member 50 is deflected in a direction such that it engages rack 102 whereby the printed circuit board is retained within channel 100. In addition, a relatively large heat surface transfer is provided, such that the heat transferred in the printed circuit board 72 can be transferred to the rack 102 which acts, in effect, as a heat sink providing a cooling effect to the components mounted to the circuit board 72.

It should be also noted that the amount of deflection of elongate portion 32 is controlled by the thickness of PC board 72 and by walls 94 and does not take a permanent set. In other words, it is deflected out to a certain point; when the side load (force applied by surface 51 to flexible portion 32 of member 50) is released, the elongated portion 32 returns to essentially its initial position. If the PC board thickness is less than the design thickness for deflection, wall 94 prevents portion 32 from deflecting uncontrollably, thus preventing the mounting apparatus from destroying itself. In particular, at the point of maximum allowable deflection, surface 60 is abutted against wall 94 thus preventing further travel of member 50. If the PC board thickness is within the design parameters, the ramps do not reach walls 94.

Although a series of four ramps are shown on members 50 and 70, more or less may be utilized. FIGS. 10a (elevation view) and 10b (perspective view) show an alternate configuration wherein only one ramp member 112 is formed on member 50'. Although not shown, a pair of coacting single ramp members would be formed on a corresponding driving member 70', the overall operation of this embodiment being identical to that of the embodiment described in FIGS. 1-7.

As will be described hereinafter, the ramp angles (angle of the inclined surface to the horizontal) are relatively small (shallow) which means that every unit of torque applied through the screw provides a much higher mechanical advantage (side load) than prior devices. Though screw threads and friction affect the side loads generated, the side loads are significantly magnified by controlling the ramp angles. If less side load is required, the ramp angles are increased, and if more side load is desired, the ramp angles are decreased.

The mounting apparatus 10 of the present invention offers a distinct advantage over previous prior art wedge type designs. As noted hereinabove, the wedges utilized to apply force to the rack as disclosed in the Kecmer and Colomins patents had angles of approximately 45°. Neglecting friction, axial load (P) is translated to side load (W) which is the load transferred to hold the circuit card in place against the heat sink or permanent retaining structure.

The formula is $$W = P \times \cot a.$$

If P = 10 pounds and a = 45°, then W = 10 pounds. The above calculation also excludes any mechanical advantage the screw threads impose on the inclined surface.

As noted previously, although this design can offer shallower angles to obtain a higher side load, it does have some design limitations. On minimum length wedge designs, the wedge angle is limited. For example, if the length was limited to two inches (an expected limitation in the field of microminiaturization), the thickness assumed to be ¼ inch, and the length of two of the end wedges was assumed to be 1 inch, the length of the middle or movable wedge is calculated to be ½ inch.

If a higher side load is required, the ramp, or wedge, angle would have to be decreased. The maximum angle that it could assume with a 2 inch length is approximately 27°. For this configuration, the side load is 19.6 pounds. Thus would be the maximum side load for the 2 inch length for an axial load of 10 pounds. If W is to be increased, then either P has to be increased or the 2 inch length has to be increased to provide a shallow angle a to take any mechanical advantage. However, typically both these variables are not available.

The apparatus of the present invention has higher side loads even at shorter lengths due to its inherent features. For example, the series of ramp angles formed in members 50 and 70 are at a relatively shallow angle to maximize side load. Assuming a ramp length of 0.350 inches and an angle of 8° with the horizontal, an axial load of ten pounds, W = 71.15 pounds. Thus, as compared with the prior art, the present invention offers a side load improvement of approximately 7 times. Even with the 27° angle version of the prior art, the present invention provides a maximum mechanical advantage of approximately 3.6 times.

The present invention allows the ramp angles to be designed as required by the user. In addition, multiple angles or arcs can be formed on a single ramp. For example, as shown in FIG. 8, the start of the ramp incline could have an angle A of 8° and then at approximately the midpoint the angle B could be changed to less than 8°, typically 3°. In this design, the first portion of the ramp angle offers a very fast rise time to pre-position the elongated portion 32 of member 30 and thereafter for maximum side loads the ramp angle flattens out to a very shallow angle. The 3+ angle offers a side load improvement to 190 pounds. It should be noted that these calculations ignore friction and screw thread mechanical advantages, but axial load is still 10 pounds as the ramp angle varies.

Another configuration is to have the ramp shaped as an arc that resembles a gear tooth 111 as shown in FIG. 9. The arc can have a rapid rise and smooth transitions into a very flat arc at the end. This configuration provides a large mechanical advantage because at the top of the ramp the approximate rise could be 1-½° to flat. For an axial load of 10 pounds at 1-½ ramp angle, a side load of 382 pounds is available.

The present invention thus provides a printed circuit board mounting apparatus, simple in design and relatively inexpensive to manufacture, which, although relatively small in length, is capable of providing large side loads. Since the ramp angles can be varied to provide a side load specified by a use without changing the external dimensions of the apparatus, the apparatus can be adapted for use in most printed circuit board installations.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. An apparatus for locking a printed circuit board within an elongated slot in a rack comprising:
   a first member comprising an elongated, flexible portion terminating in first and second end portions, a channel being formed by said member portions;
   a driving member having a bottom wall portion and first and second wall portions extending vertically from said bottom wall, at least one inclined surface extending from said bottom wall portion;
   a driven member having at least one inclined surface, said driven member being positioned in the channel formed in said driving member to form an assembly, the members being positioned such that the inclined surfaces therein are in engagement, said assembly being positioned in the channel formed in said first member; and
   a screw interconnecting said driven member, rotation of the screw in a first direction drawing said driven member in a manner such that the inclined surface therein moves along the corresponding inclined surface in said driving member whereby the flexible portion of said first member is deflected transversely from an initial position to lock a printed circuit board within an elongated slot in a rack.

2. The apparatus of claim 1 wherein the angle of said inclined surfaces is less than 45 degrees.

3. The apparatus of claim 1 wherein said screw extends through a first aperture in the first end portion of said first member through a threaded aperture in said driven member and into an aperture formed in the second end portion of said first member.

4. The apparatus of claim 1 further including means to limit the movement of the inclined surface formed on said driven member on the corresponding inclined surface on said driving member.

5. The apparatus of claim 4 wherein said limit means comprises members extending from said bottom wall in said driving member to thereby limit the movement of said driven member within the channel formed in said driving member.

6. The apparatus of claim 3 wherein a second aperture is formed in the first end portion of said first member, a pin member extending into the aperture to lock the screw in position.

7. The apparatus of claim 1 wherein rotation of the screw in a second direction causes the inclined surface on said driven member to move along the corresponding inclined surface in said driving member in a manner whereby the flexible portion of said first member returns to said initial position.

8. The apparatus of claim 1 wherein the driven member comprises a substantially rectangularly shaped member having an integral inclined surface formed on the edges of one surface thereof, an elongated portion on said one surface separating the inclined surfaces formed on each edge.

9. The apparatus of claim 8 wherein the inclined surfaces formed on said driving member are integral therewith.

10. The apparatus of claim 1 wherein the angles of said inclined surfaces are selected to provide a predetermined side load.

11. The apparatus of claim 10 wherein the assembly comprising said driven member and said driving member is selected for positioning in the channel formed in said first member when the angles of the inclined surfaces on each member correspond to said predetermined side load.

* * * * *